United States Patent
Dessert et al.

(10) Patent No.: US 7,904,024 B2
(45) Date of Patent: *Mar. 8, 2011

(54) SYSTEM AND METHOD OF ELIMINATING OR MINIMIZING LO-RELATED INTERFERENCE FROM TUNERS

(75) Inventors: David Dessert, Wylie, TX (US); John Schneider, Frisco, TX (US)

(73) Assignee: Zoran Corporation, Sunnyvale, CA (US)

( * ) Notice: Subject to any disclaimer, the term of this patent is extended or adjusted under 35 U.S.C. 154(b) by 700 days.

This patent is subject to a terminal disclaimer.

(21) Appl. No.: 11/930,703

(22) Filed: Oct. 31, 2007

(65) Prior Publication Data

US 2008/0222691 A1    Sep. 11, 2008

Related U.S. Application Data

(63) Continuation-in-part of application No. 10/952,185, filed on Sep. 28, 2004.

(60) Provisional application No. 60/941,213, filed on May 31, 2007.

(51) Int. Cl.
  H04B 1/00    (2006.01)
  H04B 17/00   (2006.01)

(52) U.S. Cl. ............... 455/63.1; 455/67.13; 455/296; 455/315; 348/725; 348/731

(58) Field of Classification Search ........... 455/63.1, 455/67.13, 150.1, 196.1, 283, 295, 296, 310, 455/311, 313, 315, 317; 348/725, 726, 731, 348/732, 555, 556, 559; 725/131, 151
See application file for complete search history.

(56) References Cited

U.S. PATENT DOCUMENTS

| | | | |
|---|---|---|---|
| 5,519,890 | A | 5/1996 | Pinckley |
| 5,737,035 | A | 4/1998 | Rotzoll |
| 6,057,876 | A | 5/2000 | Waight |
| 6,151,488 | A | 11/2000 | Brekelmans et al. |
| 6,272,191 | B1 | 8/2001 | Inamori et al. |
| 6,308,056 | B1 | 10/2001 | Abe et al. |
| 6,567,654 | B1 | 5/2003 | Coronel Arredondo et al. |
| 6,725,463 | B1 | 4/2004 | Birleson |
| 6,785,527 | B2 | 8/2004 | Earls |
| 6,861,968 | B2 | 3/2005 | Melanson et al. |
| 6,876,839 | B2 | 4/2005 | Harris |

(Continued)

FOREIGN PATENT DOCUMENTS

EP    0 595 314 A1    5/1994

(Continued)

OTHER PUBLICATIONS

International Search Report and Written Opinion issued for PCT/US2008/065069; Dated: Jul. 28, 2008; 11 Pages.

(Continued)

*Primary Examiner* — Quochien B Vuong
(74) *Attorney, Agent, or Firm* — Fulbright & Jaworski L.L.P.

(57) ABSTRACT

Systems and methods of eliminating or reducing interference resulting from harmonics of local oscillator frequencies of mixers are shown. In one embodiment, a determination is made as to a zone or zones within an intermediate frequency band associated with undesired spurs. Inter-tuner spurs and intra-tuner spurs may be identified such that frequency information of the identified spurs may be utilized to define a plurality of exclusion zones. Local oscillator frequencies may subsequently be efficiently selected in view of the exclusion zone information. Embodiments may also determine a score for identified spurs which may be used to optimally select from within a set of spur-generating local oscillator frequencies.

30 Claims, 7 Drawing Sheets

U.S. PATENT DOCUMENTS

| | | |
|---|---|---|
| 6,898,420 B2 | 5/2005 | Black et al. |
| 6,968,278 B1 | 11/2005 | Christensen, III et al. |
| 2004/0002318 A1 | 1/2004 | Kerth et al. |
| 2004/0250284 A1 | 12/2004 | Dong et al. |
| 2005/0047486 A1 | 3/2005 | Sakaue et al. |
| 2006/0068708 A1 | 3/2006 | Dessert et al. |
| 2007/0053414 A1 | 3/2007 | Payne et al. |

FOREIGN PATENT DOCUMENTS

| | | |
|---|---|---|
| EP | 1 182 774 A2 | 2/2002 |
| EP | 1 233 508 A2 | 8/2002 |
| GB | 2 414 351 A | 11/2005 |

OTHER PUBLICATIONS

International Search Report and Written Opinion issued for PCT/US2005/034819 dated Jan. 24, 2006.

SYSTEM AND METHOD OF ELIMINATING OR MINIMIZING LO-RELATED INTERFERENCE FROM TUNERS

CROSS-REFERENCE TO RELATED APPLICATIONS

The present application claims the benefit of priority to co-pending and commonly assigned U.S. provisional patent application Ser. No. 60/941,213 entitled "System and Method of Eliminating or Minimizing Lo-Related Interference From Tuners," filed May 31, 2007, and is a continuation-in-part of co-pending, commonly assigned U.S. patent application Ser. No. 10/952,185 entitled "System and Method of Eliminating or minimizing Lo-Related Interference From Tuners," filed Sep. 28, 2004, the disclosures of which are hereby incorporated herein by reference. The present invention is related to co-pending and commonly assigned U.S. patent application Ser. No. 11/325,854 entitled "System and Method for Discovering Frequency Related Spurs in a Multi-Conversion Tuner," filed Jan. 5, 2006, Ser. No. 08/904,693, now U.S. Pat. No. 6,725,463, entitled "Dual Mode Tuner for Co-Existing Digital and Analog Television Signals," filed Aug. 1, 1997, and Ser. No. 11/486,706 entitled "Broadband Integrated Tuner," filed Jun. 29, 2006, the disclosures of which are hereby incorporated herein by reference.

TECHNICAL FIELD

The invention generally relates to tuner circuits and more particularly to the identification and/or elimination or reduction of spurious signals in multiple conversion tuners.

BACKGROUND OF THE INVENTION

In a tuner or frequency converter (such as, for example, a dual-conversion tuner), an incoming signal at frequency $f_{IN}$ is mixed with a signal at frequency $f_{LO1}$ from a local oscillator (LO) to produce a signal at an intermediate frequency $f_{IF}$. This signal may then be mixed with a signal at frequency $f_{LO2}$ from a second local oscillator signal to produce the desired output frequency $f_{OUT}$, in a dual conversion tuner configuration. This process is illustrated in FIG. 1A, which is a portion of one example of a tuner (shown as RF converter 10) showing how the $f_{LO}$ signals (provided by LO 12 and 13) are mixed. Such a tuner is shown in U.S. Pat. No. 5,737,035, issued Apr. 7, 1998 hereby incorporated by reference herein. Typically, but not always, the frequency of first local oscillator. e.g., LO 12, is greater than that of second local oscillator, e.g., LO 13. That is, generally $f_{LO1} > F_{LO2}$. Accordingly, reference shall be made herein to equations in which it is assumed that $f_{LO1} > f_{LO2}$. However, it should be appreciated that the formulae herein are applicable to situations in which $f_{LO2} > f_{LO1}$, such as by replacing $f_{LO1}$ with $f_{LO2}$ and replacing $f_{LO2}$ with $f_{LO1}$ in situations where $f_{LO2} > f_{LO1}$.

FIG. 1B shows a simplified diagram of two mixing stages with the filtering omitted. These filters ultimately determine final bandwidth ($f_{BW}$) of the tuner, but since they do not contribute to the production of LO-related spurs, they are omitted from FIG. 1B.

An adverse effect of the dual conversion process is the introduction of LO-related spurs into the tuned signal. These spurs are created by combinations of the harmonics of the LO frequencies used ($f_{LO1}$ and $f_{LO2}$). To improve sensitivity and selectivity in modern tuners, there is a need to minimize the foregoing spurious frequency elements (spurs) and noise that can occur in the tuner output.

The frequency of each of the LO-related spurs can be calculated as:

$$f_{SPUR} = n \times f_1 - m \times f_2 \quad (1)$$

where n and m are integer numbers representing, respectively the harmonics of the high and low local oscillator frequencies, and $f_1$ and $f_2$ are the local oscillator frequencies (e.g., $f_{LO1}$ and $f_{LO2}$, respectively where $f_{LO1} > f_{LO2}$). If any spur generated by a given combination of $f_{LO1}$ and $f_{LO2}$ falls within the output bandwidth ($f_{BW}$) of the converter/tuner, that spur can degrade the quality of the output signal. If a spur does exist within the desired output bandwidth, the LO frequencies can be adjusted to different values to avoid the spur falling within the output band. As manufacturing processes produce denser and faster IC's, the number of harmonics ($n_{MAX}$) that must be considered continues to increase. Since the number of LO frequency combinations that can possibly create spurs in n harmonics is $n^2$ the amount of resources required to avoid the spurs increases dramatically as technology improves. As an example, at the time the circuit shown in FIG. 1A was initially produced, the number of harmonics (n) that were typically taken into consideration was 5. Currently, the number of harmonics typically taken into consideration is on the order of 15.

One reason why it is important to avoid LO spurious products is that a spur which is venerated by multiples of $f_{LO1}$ and $f_{LO2}$ in a double conversion system will often have a power level which is much greater than the actual RF signal. Therefore, if a spur caused by a product of $f_{LO1}$ and $f_{LO2}$ falls in the desired IF output pass band, its amplitude (power level) may be larger than the IF output level of the original desired signal, corrupting the performance of the mixer itself.

One of the fixes for this problem is that when it is known that a certain spur (such as a spur associated with two times the first LO and three times the second LO) will fail within the output pass band, the LO frequencies can be changed (up or down) a certain amount, which will, in effect, still allow the circuit to tune to the desired output frequency, but the spur will be moved up or down and outside of the output bandwidth of the tuner.

Accordingly, one method for identifying spurs falling within a particular band, such as the tuner output band, is to look at all the harmonics of the first LO, mixed with all the harmonics of the second LO and, one by one, check off each one. Thus, if a circuit designer is looking up to the 15$^{th}$ harmonic of the first LO and the 15$^{th}$ harmonic of the second LO, the designer checks one times $f_{LO1}$ (first harmonic) and one times $f_{LO2}$ (first harmonic) to see if there is a spur of concern. If there is no spur of concern, then the designer continues with one times $f_{LO1}$ (first harmonic) and two times $f_{LO2}$ (second harmonic) to see if there is a spur of concern. If not, then the process continues with one times $f_{LO1}$ (first harmonic) and three times $f_{LO2}$ (third harmonic) to see if there is a spur of concern. Once all harmonics of $f_{LO2}$ have been considered, the harmonic of the first LO frequency may be incremented and each harmonic of the second LO frequency again considered. That is, the designer continues with two times $f_{LO1}$ (second harmonic) and one times $f_{LO2}$ (first harmonic) to see if there is a spur of concern, and so on. This results in $n^2$ combinations being looked at. This is a time consuming method. Even assuming that the mathematics of how spurs are generated allows for the elimination of quite a few of the coefficients for the first and second LO, the operation remains essentially an $n^2$ operation.

It should be appreciated that spur identification and avoidance as discussed above is dependent on the circuit that is being used and which spurs might come through the chip more strongly than other spurs. It is also dependent on the input frequency and on all the specific channels that might be on the input frequency. That method is also specific to the first IF frequency and to the output frequency. Thus, for each application of a circuit the chip designer generally must employ a unique program for each channel input lineup in the desired frequency spectrum. This then implies that a different spur avoidance algorithm must be created for every customer application, i.e., each tuner implementation.

The foregoing spurs, resulting from harmonics of the local oscillator frequencies of a same tuner, are referred to herein as intra-tuner spurs. It should be appreciated, however, that various devices, such as Plug-and-Play™, TiVo™, set-top boxes, and televisions with picture-in-picture, may utilize two or more tuners or frequency converters. Accordingly, spur types and sources, other than the aforementioned intra-tuner spurs, also may exist.

In the current state of the art, tuners are often separately packaged and engage separate portions of the device in order to minimize tuner interference. By maintaining some physical separation between tuners of such devices cross-talk and interference generated by the tuners can be minimized. However, the ability to maintain useful separation between tuners has been limited as the size of such devices continues to diminish. Development is also being made to integrate two or more tuners on a single circuit board. One challenge of miniaturization of such devices is the elimination or minimization of multi-tuner interference. RF shielding and/or extensive RF filtering and circuitry is often needed to suppress tuner generated interference.

An example of a system including a plurality of double conversion tuners (shown as tuners 106 and 108) is shown as tuner system 100 in FIG. 1C. In each of tuners 106 and 108, an incoming signal at frequency $f_{IN}$ is mixed with a signal at frequency $f_{LO1}$ from a local oscillator (LO) to produce a signal at an intermediate frequency $f_{IF}$, and this signal is then mixed with a signal at frequency $f_{LO2}$ from a second local oscillator to produce the desired output frequency $f_{OUT}$, as discussed above. However, in dual tuner system 100, multiple LOs may be utilized to produce two desired output frequencies, $f_{OUT,1}$ and $f_{OUT,2}$. In the example of FIG. 1, each tuner 106 and 108 includes a pair of mixers, shown here as mixers 110 and 112 and mixers 114 and 116, respectively, wherein the $f_{LOi,j}$ signals are mixed to produce $f_{OUT,1}$ and $f_{OUT,2}$.

Single tuner systems can have intra-tuner spurs related to the frequency harmonics of one or more associated local oscillators. Multiple tuner systems can be affected by both intra-tuner spurs and inter-tuner spurs (spurs related to the frequency harmonics of one or more local oscillators of another tuner in the system). That is, as in a single tuner system, each tuner of a multiple tuner system may be affected by intra-tuner spurs related to the harmonics of its own local oscillator(s). Additionally, each tuner in a multiple tuner system may be affected by inter-tuner spurs which are spurs related to frequency harmonics of local oscillators of both the subject tuner and any neighboring tuner(s).

An efficient method of identifying and/or eliminating or minimizing the effects of spurs, whether intra-tuner spurs or inter-tuner spurs, would be desirable.

BRIEF SUMMARY OF THE INVENTION

The present invention is directed to systems and methods of identifying and/or eliminating or reducing interference resulting from harmonics of local oscillator frequencies of mixers in a tuner system. In one embodiment, a determination is made as to a zone or zones in which harmonics result in undesired spur generation. In preferred embodiments of the invention, one or more exclusion zones of local oscillator frequency combinations are identified within which spurs are generated. In some situations spurs in the tuner output are unavoidable. For example, the opportunity to adjust local oscillators may be limited to a range of frequencies within which one or more spurs always exist. As some spurs are more significant (e.g., cause greater interference) than other spurs, preferred embodiments of the invention may also determine a score for identified spurs which may be used to optimally select from within a set of spur-generating local oscillator frequencies.

In one embodiment, a method of the present invention identifies inter-tuner spurs and intra-tuner spurs and utilizes frequency information of the identified spurs to define a plurality of exclusion zones. LO frequencies may subsequently be efficiently selected in view of the exclusion zone information. In a preferred embodiment, the selection of local oscillator frequencies hinges on the selection of a preferred intermediate frequency, IF, of the tuner. As described herein, a preferred IF may be identified with knowledge of the boundaries of the exclusion zone.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present invention, reference is now made to the following descriptions taken in conjunction with the accompanying drawing, in which.

DETAILED DESCRIPTION OF THE INVENTION

Figure 1A:
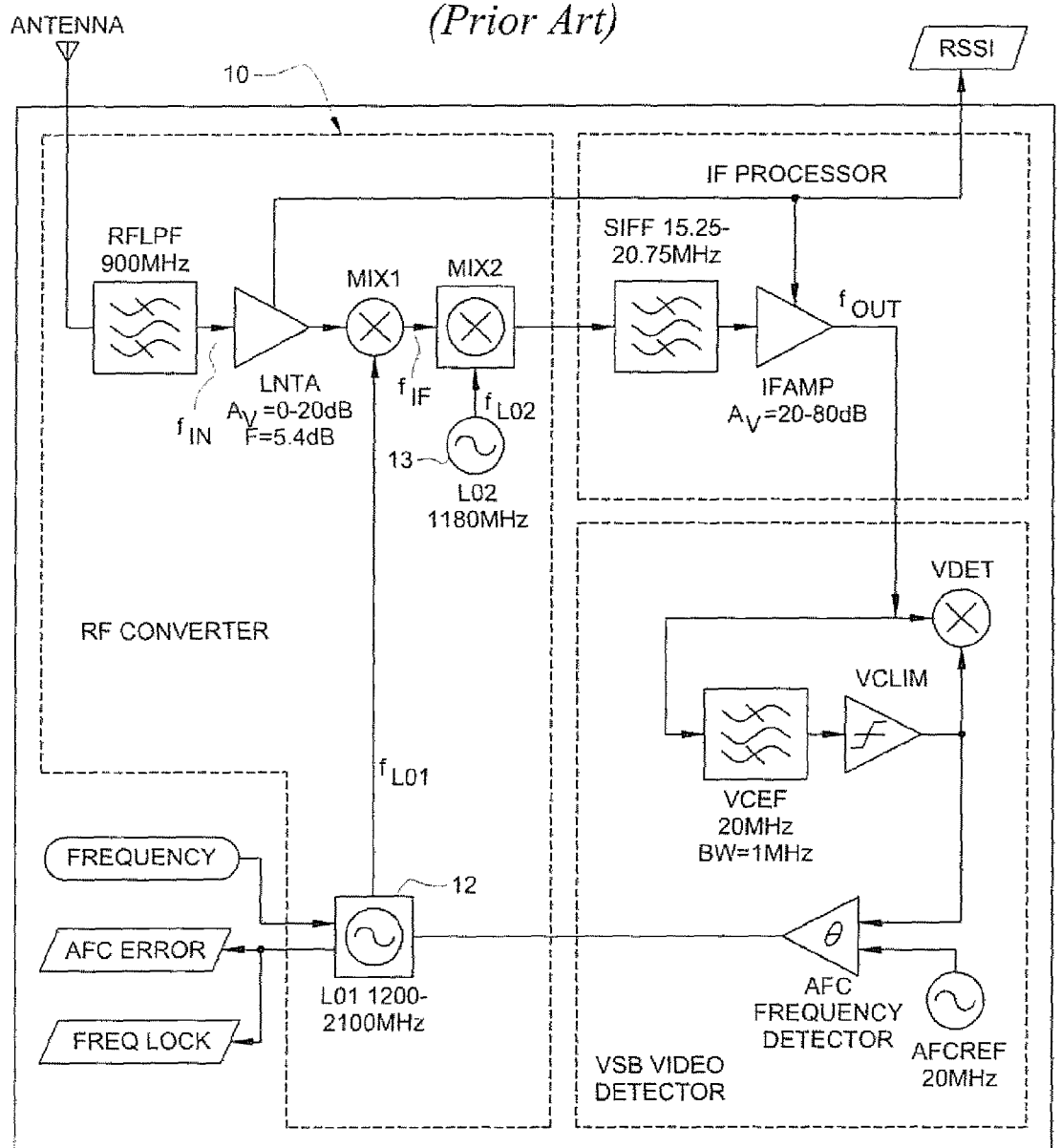
FIG. 1A is a prior art dual conversion tuner system.
Figure 1B:
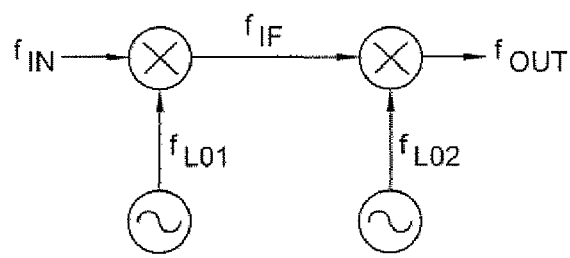
FIG. 1B is a simplified diagram of two mixing stages, with filtering omitted, of a prior art dual conversion tuner.
Figure 1C:
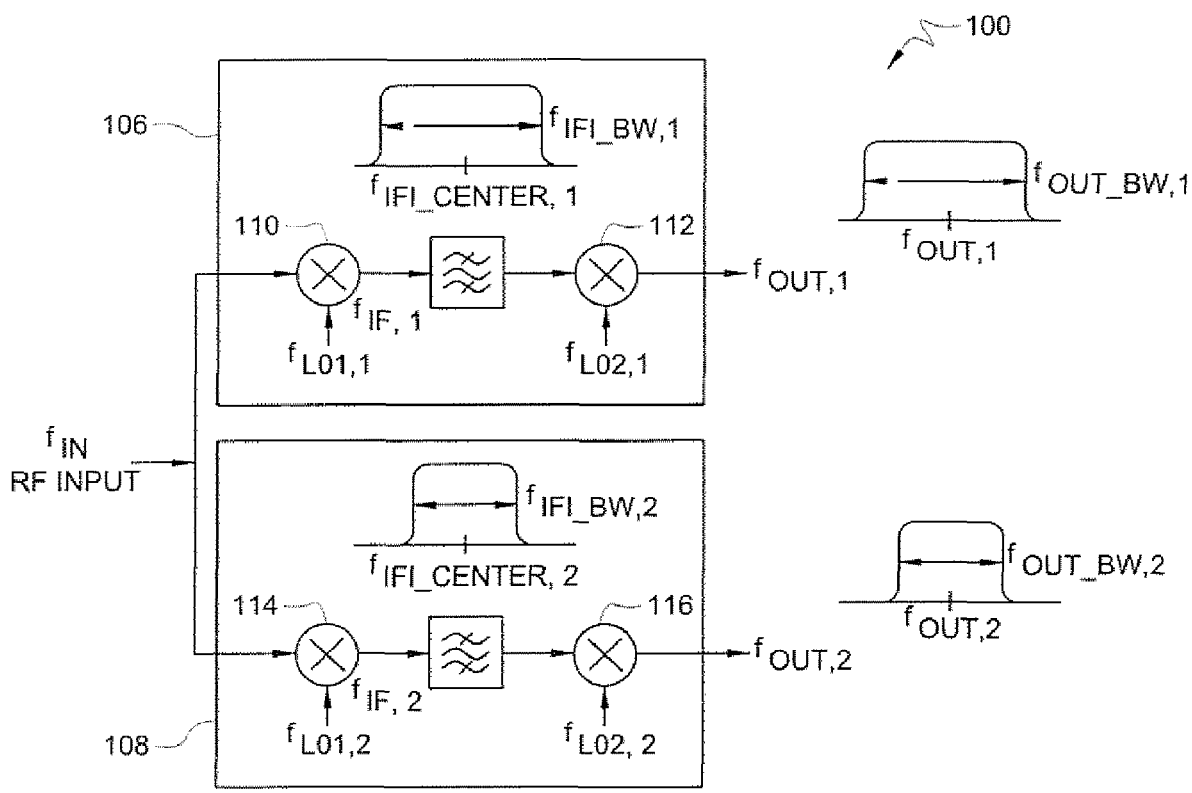
FIG. 1C is a simplified diagram of a multiple tuner system of the prior art, wherein each tuner has a pair of mixing stages.

One of the known approaches to spur elimination is to change the LO frequencies of the tuner in order to shift the spur outside of an output bandwidth or an output band of interest. For a given spur (such as a spur associated with two times the first LO and three times the second LO) that falls within the output pass band, the LO frequencies can be changed (up or down) a certain amount, which will, in effect, still allow the circuit to tune to the desired output frequency, but the spur will be shifted up or down and outside of the output bandwidth of the tuner. The invention disclosed herein is directed, in one aspect, toward efficient selection of LO frequencies in order to minimize or eliminate one or more spurs from an output pass band. The concepts of the present invention may be applied to eliminate or minimize LO-related interference in single tuner systems (e.g., intra-tuner spurs in multi-conversion tuners) as well as to eliminate or minimize LO-related interference in multiple tuner systems (e.g., intra-tuner spurs in multi-conversion tuners and inter-tuner spurs between multiple tuners).

Efficient identification of spurs is desirable. One method for identifying spurs following within a particular band, such as the tuner output band or other band of interest, is to look at all the harmonics of the first LO, mixed with all the harmonics of the second LO and, one by one, check off each one. Thus, if a circuit designer is looking up to the 15$^{th}$ harmonic of the first LO and the 15$^{th}$ harmonic of the second LO, the designer checks one times $f_{LO1}$ (first harmonic) and one times $f_{LO2}$ (first harmonic) to see if there is a spur of concern. If there is no spur of concern, then the designer continues with one times $f_{LO1}$ (first harmonic) and two times $f_{LO2}$ (second harmonic) to see if there is a spur of concern. If not, then the process continues with one times $f_{LO1}$ (first harmonic) and three times $f_{LO2}$ (third harmonic) to see if there is a spur of concern. Once all harmonics of $f_{LO2}$ have been considered, the harmonic of the first LO frequency may be incremented and each harmonic of the second LO frequency again considered. That is, the designer continues with two times $f_{LO1}$ (second harmonic) and one times $f_{LO2}$ (first harmonic) to see if there is a spur of concern, and so on. This results in n$^2$ combinations being looked at. This is a time consuming method. Even assuming that the mathematics of how spurs are generated allows for the elimination of quite a few of the coefficients for the first and second LO, the operation remains essentially an n$^2$ operation.

Another method for identifying spurs is disclosed in the above referenced patent application entitled "System and Method for Discovering Frequency Related Spurs in a Multi-Conversion Tuner." In a disclosed embodiment, a determination is made as to a band or bands in which harmonics could possibly result in interference and determining which combination of LO frequencies result in harmonics not falling within the determined band or bands. Preferred embodiments leverage the fact that harmonics of a particular frequency are evenly spaced to avoid examining all of the possible harmonics. For example, rather than calculate every harmonic and check that each calculated harmonic does not fall within the determined band or bands, embodiments of that invention determine the smallest harmonics that are greater than each edge of the determined band or bands. An interfering spur, a difference of the LO harmonics falling within the band or bands, may be determined to exist where the smallest harmonic difference for a particular LO harmonic that is greater than a first edge of a determined band is not equal to the smallest harmonic difference for the particular LO harmonic that is greater than a second edge of the determined band.

Once spurs have been identified, they can be eliminated by selecting different LO frequencies. Such LO frequency selection can be via a random process, e.g., a new set of LO frequencies can be randomly selected and the spur calculations again performed to determine whether a spur exists within the band of interest. However, a more efficient method for selecting alternative LO frequencies would be desirable.

Figure 2:
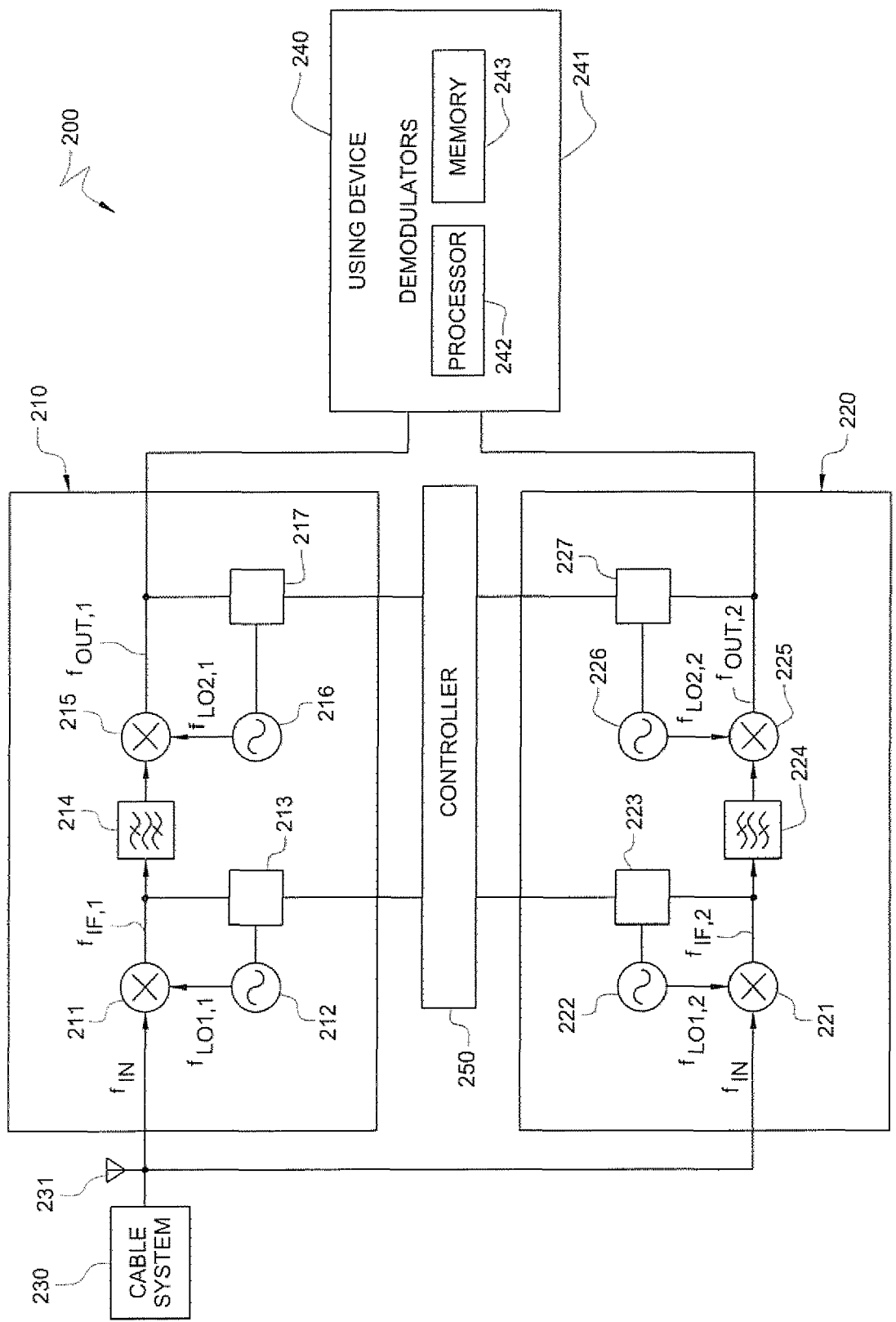
FIG. 2 shows one embodiment of a system using the concepts of the present invention.

FIG. 2 shows a simplified block diagram of multiple tuner system 200 having a pair of double conversion tuners, shown here as tuners 210 and 220. Examples of devices comprising such a system include a set-top cable box, cable modem, Plug-and-Play™ device, TiVo™ device, and a television with picture-in-picture capability. RF signals are input to multiple tuner system 200. Although the illustrated embodiment shows RF signals being provided by cable system 230 and antenna 231, RF signals may be received from any number of sources, such as a satellite system, or other signal source.

In the illustrated embodiment of multiple tuner system 200, tuners 210 and 220 are double conversion tuners. However, embodiments of the present invention may be utilized with respect to systems in which one or more tuners provide frequency conversion in a number of stages of different than that illustrated, e.g., single conversion tuners, triple conversion tuners, quadruple conversion tuners, etcetera. Moreover, embodiments of the present invention may be utilized with respect to tuner systems having a number of tuners different than that illustrated, e.g., single tuner systems, triple tuner systems, quadruple tuner systems, etcetera. The exemplary embodiment, however, is shown with respect to multiple tuners, each having multiple frequency conversion stages, in order to concisely present concepts of the present invention.

A first mixer of tuner 210, mixer 211, is connected to the RF input signal, $f_{IN}$, and the output, $f_{LO1,1}$, of LO 212. Mixer 211 receives both the RF input signal, $f_{IN}$, and the first LO signal produced by LO 212, $f_{LO1,1}$, and generates an output signal, which may be called the first IF, shown as $f_{IF,1}$. The frequency of the signal produced by LO 212 is controlled by a tuning a phase locked loop or other local oscillator control circuit, shown as circuit 213, which is, in turn, controlled by system controller 250 through a control interface.

The first IF signal, generated by mixer 211, is connected through IF filter 214, which attenuates undesired signals. The output of IF filer 214 is connected to a second mixer of tuner 210, mixer 215. Once the first IF signal generated by mixer 211 has been filtered, it is mixed with a second local oscillator signal, $f_{LO2,1}$, generated by local oscillator 216, whose output is connected to mixer 215. Mixer 215 operates to generate an output signal, $f_{OUT,1}$. The frequency of the signal produced by LO 216 is controlled by tuning a phase locked loop or other local oscillator control circuit, shown as circuit 217, which is, in turn, controlled by system controller 250 through a control interface.

In a similar manner, tuner 220 has mixers 221 and 225, LOs 222 and 226, circuits 223 and 227, and IF filter 224. Tuner 220 of embodiments operates as described above with respect to tuner 210, although LOs 222 and 227 may be controlled independently of LOs 212 and 217 to provide a different signal (e.g., channel) as an output signal, $f_{OUT,2}$, of tuner 220.

The output signals of tuners 210 and 220 of the illustrated embodiment are provided to using device 240, such as may comprise a set-top cable box, cable modem, Plug-and-Play™ device, TiVo™ device, a television with picture-in-picture capability, or the like. Using device 240 may comprise various circuits, such as demodulator 241, processor 242, and memory 243, utilized in further processing the signals output from tuners 210 and 222.

As a set of new (different) carrier frequencies are selected (e.g., one or more new channels are selected), one or more LO frequencies of tuners 210 and/or 220 are adjusted by operation of controller 250. LO frequencies should be carefully chosen to avoid spurious signals appearing in the output band of interest associated with tuners 210 and 220. Although a number of LO frequencies may provide conversion of a signal from a particular RF carrier frequency to a particular output frequency, many such LO frequency combinations will have spurs associated therewith which also fall within the IF frequency bandwidths and/or output frequency bandwidths of either or both of tuners 210 and 220. Accordingly, before implementation of a particular LO frequency combination for tuning to a desired signal by tuners 210 and 220, the LO-related spurs are analyzed according to embodiments of the invention for undesired spurs. In device 200 of the illustrated embodiment, selection of LO frequencies and the associated spur analysis is done dynamically, such as at the time of channel selection. Accordingly, concepts of the present invention can be employed to minimize delay in tuning to selected channels.

One advantage of systems and methods of the present invention is time savings for alignment, when a tuner is used over a wide range of frequencies. In such a situation it is important to find the LO spurs quickly with as few calculations as possible as these calculations are made every time a channel is changed. Controller 250 of embodiments, which may be implemented in software, hardware or both, enables the first IF generated by the first mixer to be varied dynamically in order to solve the problem of spurious signal generation at certain channel values. Efficient selection of LO frequencies to avoid or minimize spurs is one object of an embodiment of the present invention.

A discussion of two types of spurs follows. Referring still to FIG. 2, two double conversion tuners with a single RF input are provided. Each of the tuners has a separate output which may be a different (or the same) channel. Each tuner may have certain spurs, referred herein as "intra-tuner" spurs, which are related to the local oscillators of the associated tuner. The frequency of each of the intra-tuner Lo-related spurs can be calculated according to equation (1) set forth above, which has been repeated below for convenience:

$$f_{SPUR} = n \times f_1 - m \times f_2 \quad (1)$$

where n and m are integer numbers representing respectively the harmonics of the high and low local oscillator frequencies, and $f_1$ and $f_2$ are the local oscillator frequencies (e.g., $f_{LO1}$, and $f_{LO2}$, respectively where $f_{LO1} > f_{LO2}$). If any spur generated by a given combination of $f_{LO1}$ and $f_{LO2}$ falls within the output bandwidth ($f_{BW}$) of the tuner, that spur can degrade the quality of the output signal.

Each tuner may also have "inter-tuner" spurs related to local oscillators of one or more neighboring tuners. Generation of these output spurs is dependent on the particular local oscillator frequencies of the neighbor tuner.

Inter-tuner spurs can be calculated as:

$$f_{SPUR,1} = n \times f_{LO1,1} + m \times f_{LO1,2} - f_{LO2,1} \quad (2)$$

$$f_{SPUR,2} = n \times f_{LO1,1} + m \times f_{LO1,2} - f_{LO2,2} \quad (3)$$

where n and m are integers and $|n| \leq$ max_harmonics and $|m| \leq$ max_harmonics, and where max_harmonics=maximum number of harmonics of one tuner's LO which are present in another tuner's output, and where $f_{LO1,i}$=tuner i's first LO frequency and $f_{LO2,i}$=tuner i's second LO frequency. For the tuners 210 and 220 of FIG. 2, equation (2) defines spurs falling within the output band of tuner 210, while equation (3) defines spurs falling within the output band of a tuner 220.

Therefore, intra-tuner and inter-tuner spur equations for multiple tuner systems are as follows:

$$f_{SPUR,i} = n \times f_{LO1,i} - m \times f_{LO2,i} \quad (4)$$

$$\text{for } i=2 \rightarrow n, \; f_{SPUR,1} = n \times f_{LO1,1} + m \times f_{LO1,i} - f_{LO2,1} \quad (5)$$

and $$\text{for } i=2 \rightarrow n, \; f_{SPUR,i} = n \times f_{LO1,1} + m \times f_{LO1,i} - f_{LO2,i} \quad (6)$$

where equation (4) is all equation for intra-tuner spurs, equation (5) is an equation for inter-tuner spurs in a first tuner of a multiple tuner system, and equation (6) is an equation for inter-tuner spurs in tuners 2 through n in a multiple tuner system.

Equations (1) through (6) permit identification of two types of spurs in the tuner output band of interest. Other spurs may exist and could also be determined. As described herein, if a spur does exist within the desired output bandwidth, the LO frequencies may be adjusted to different values to avoid the spur falling within the output band.

The characteristic movement of spurs in response to different LO frequencies can be used to determine a particular range or continuum of first IF values yielding a spur in the output bandwidth. According to embodiments of the invention, this particular range of first IF values defines an exclusion zone of first IF values associated with a particular spur. First IF values within the exclusion zone yield a spur in the tuner output bandwidth. First IF values outside of the exclusion zone yield a tuner output which is free of the particular spur. In this manner, by selecting a particular IF value a known spur may be rejected at the output. At other times, a spur-free tuner output may not be possible and a choice between known spurs may be desired in order to minimize the detrimental effect on tuner performance. As described herein in further detail, a scoring system can be utilized to rank particular spurs and to facilitate selection of local oscillator frequencies yielding a spur with minimal detrimental effect on tuner performance.

The frequency of a spur within the output bandwidth is a function of associated local oscillator frequencies. In multiple tuner devices a spur frequency of one tuner can be a function of the frequencies of local oscillators of another tuner (inter-tuner spurs). By varying the frequencies of associated local oscillators, a tuner spur may be shifted out of the tuner output bandwidth.

Figure 3:
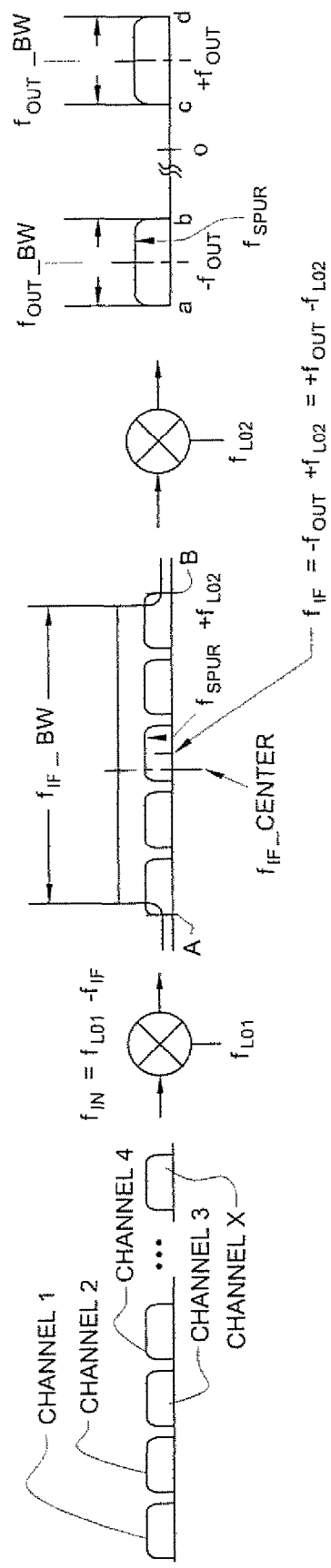
FIG. 3 illustrates a double conversion tuner having a spurious signal in an output band of the tuner.

FIG. 3 illustrates a tuner having an input signal, $f_{IN}$, and a local oscillator signal, $f_{LO1}$, connected to a first mixer (e.g., mixer 211 of tuner 210 or mixer 221 of tuner 220 shown in FIG. 2). The first mixer generates an output signal within a first IF bandwidth, $f_{IF\_BW}$. The output signal generated by the first mixer, is connected to a second mixer (e.g., mixer 215 of tuner 210 or mixer 225 of tuner 220 shown in FIG. 2), where it is mixed with a second local oscillator signal, $f_{LO2}$. The second mixer generates an output signal and its image, $-f_{OUT}$ ($-f_{OUT} = f_{IF} - f_{LO2}$) and $+f_{OUT}$ ($f_{OUT} = f_{IF} + f_{LO2}$), each having bandwidth $f_{OUT\_BW}$.

Any spur, $f_{SPUR}$, that falls within the output band or its image is of concern and, therefore, is most likely undesirable. The illustrated embodiment shows spur $f_{SPUR}$ in the output bandwidth of $-f_{OUT}$. For simplification in explaining the concepts of the present invention, $f_{SPUR}$ will be assumed to be an intra-tuner spur, as can be represented by equation (1) given above as $f_{SPUR}=n \times f_{LO1}+m \times f_{LO2}$. Of course, $f_{SPUR}$ may comprise an inter-tuner spur, as can be represented by either equation (2), given as $f_{SPUR,1}=n \times f_{LO1,1}+m \times f_{LO1,2}-f_{LO2,1}$ above, or equation (3), given as $f_{SPUR,2}=n \times f_{LO1,1}+m \times f_{LO1,2}-f_{LO2,2}$ above.

FIG. 3 also shows the location of a predetermined first intermediate frequency (IF), ($f_{IF}=f_{OUT}+f_{LO2}$). The first IF in the illustrated embodiment is different than of the IF filter. In other embodiments, the first IF can be equal to the center frequency of the IF filter.

Figure 4:
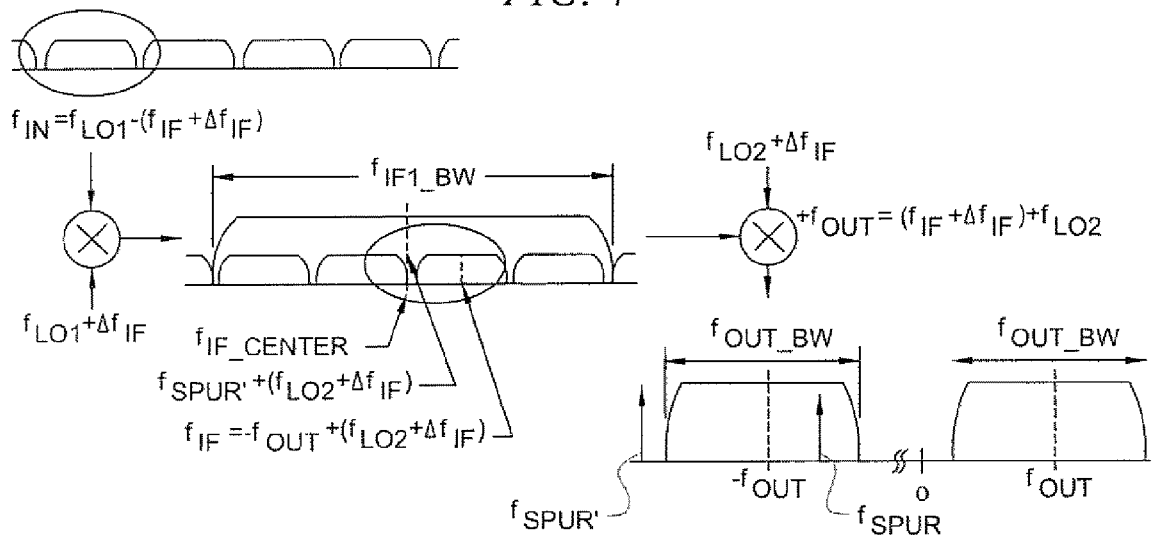
FIG. 4 illustrates the double conversion tuner of FIG. 3 wherein the spurious signal has been shifted out of the output band of the tuner and into an adjacent channel.

FIG. 4 graphically illustrates the movement of the output spur from the location in FIG. 3 to a new location at $f_{SPUR'}$ which is outside of the tuner's output bandwidth. The position of the spur at $f_{SPUR'}$ shifted as a result of a change $f_{IF}$ in by an amount equal to $\Delta f_{IF}$. AS intermediate frequency, $f_{IF}$, is equal to $f_{LO2}+f_{OUT}$, and since it is preferred that $f_{OUT}$ remain fixed, the change in $f_{IF}$ results from a change in the frequency of LO2. For comparison, the location of the spur from FIG. 3 is shown in phantom lines.

Figure 5:
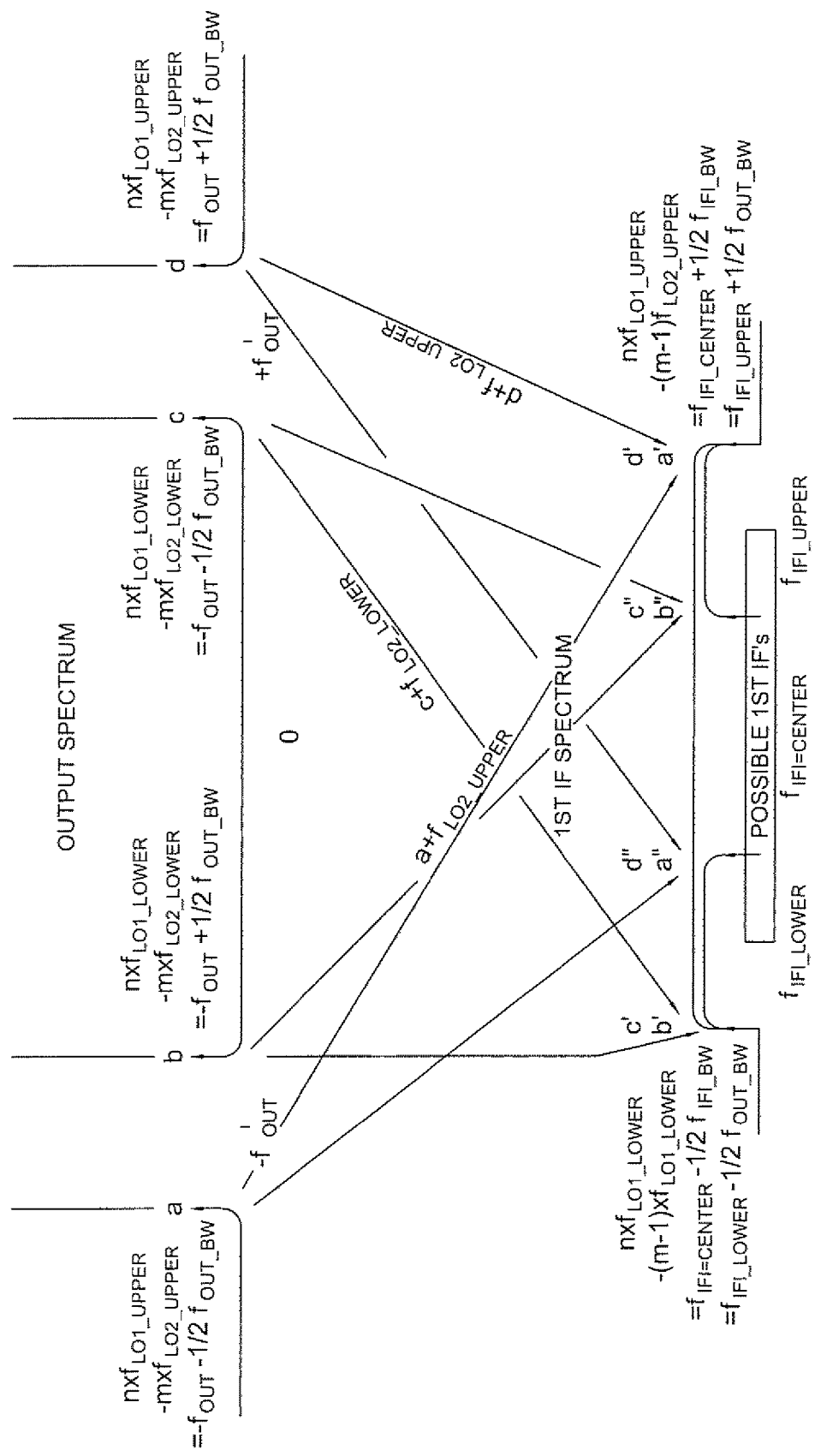
FIG. 5 shows the relationship of spur frequencies in the output bands to intermediate frequencies.

The relationship of the IF bandwidth to the output bandwidth of the system of FIGS. 3 and 4 is provided in FIG. 5. FIG. 5 illustrates the range of intermediate frequency spurs which result in spurs at the edges of the output bands. Specifically, a spur located at point "a" in the output bandwidth will appear in the range of intermediate frequencies from a' to a" in the intermediate frequency bandwidth. Similarly, a spur located at point "b" in the output bandwidth will appear in the range of intermediate frequencies from b' to b", a spur located at point "c" in the output bandwidth will appear in the range of intermediate frequencies from c' to c", and a spur located at point "d" in the output bandwidth will appear in the range of intermediate frequencies from d' to d". Accordingly, FIG. 5 shows that there is a definable range of IF frequencies within which a spur will remain in the output channel, and that this range is bounded by c', b', and a', d' at which point the spur transitions out of the output channel and into an adjacent channel. Equations of interest include:

$$f_{SPUR} = n \times f_{LO1} - m \times f_{LO2} \quad (7)$$

$$f_{out} - \frac{1}{2} f_{out-BW} \le f_{spur} \le f_{out} + \frac{1}{2} f_{out-BW} \quad (8)$$

$$f_{SPUR}1 = n \times f_{LO1} - (m-1) \times f_{LO2} \quad (9)$$

$$m = \frac{nxf_{LO1} - f'_{spur} + 1}{f_{LO2}} \quad (10)$$

Where $f_{SPUR}$ is the spur location in the output bandwidth and $f_{SPUR'}$ is the spur location in the intermediate frequency bandwidth.

As mentioned above, a spur such as $f_{SPUR}$ appearing in either the output frequency or its image, $+f_{OUT}$ and $-f_{OUT}$, bandwidth is undesirable. Accordingly, a spur appearing at a frequency between $-f_{OUT}-f_{OUT\_BW}$ and $-f_{OUT}+f_{OUT\_BW}$ (the frequency range associated with $f_{OUT\_BW}$ at $+f_{OUT}$) or between $+f_{OUT}-f_{OUT\_BW}$ and $+f_{OUT}+f_{OUT\_BW}$ (the frequency range associated with $f_{OUT\_BW}$ at $+f_{OUT}$) is undesirable. As can be readily appreciated, the foregoing output frequency boundaries are defined by 4 points, shown as points a, b, c, and d, respectively, in FIGS. 3 and 5. Moreover, the calculations associated with identifying spurs within the identified frequency ranges include negative numbers, e.g., where $f_{LO2}$ is greater than $f_{IF}$. In order to simplify identification of spurs falling within the bandwidth of the output frequency or its image, embodiments of the present invention operate to perform spur analysis in association with an intermediate frequency, wherein the frequencies of interest are bounded by 2 points (e.g. points c and d in FIGS. 3 and 5) and/or where negative numbers in the calculations associated with the frequency ranges may be avoided.

Directing attention again to FIG. 3, points between which frequencies of spurs translated to the first intermediate frequency range are likely to be of interest are shown as points A and B (corresponding to points b', c' and a', d' in FIG. 5). In the illustrated embodiment, points A and B are associated with an edge of the outermost channels passed, or substantially passed, by the intermediate frequency bandwidth, $f_{IF\_BW}$, as may be defined by an intermediate frequency filter or filters. That is, point A is associated with a lowest frequency edge of a lowest frequency channel passed, or substantially passed, by the intermediate frequency bandwidth and point B is associated with a highest frequency edge of a highest frequency channel passed, or substantially passed, by the intermediate frequency bandwidth. These points delineate the upper and lower limits of wherein an output channel may appear in the intermediate frequency bandwidth. By translating potential output spur frequencies to this intermediate frequency bandwidth, by adding the second local oscillator frequency ($f_{LO2}$) thereto, analysis with respect to whether the translated spur frequency falls between 2 points (A and B) may be utilized to identify spurs of interest. Moreover, the computations are simplified by avoiding negative numbers. In operation according to a preferred embodiment, all spurs that could appear within the intermediate frequency bandwidth are identified in one step of a process and are thereafter used to identify intermediate frequency exclusion zones.

Embodiments of the present invention operate to analyze spurs utilizing spur formulae translated to the intermediate frequency to determine if they fall between points A and B demarcating the minimum and maximum IF frequencies which may appear in the output bandwidth. It should be appreciated that the output bandwidth ($f_{OUT\_BW}$) is a frequency range that translates to a corresponding frequency range ($f_{IF\_OUT\_BW}$) within the intermediate frequency bandwidth, where:

$$f_{IF\_OUT\_BW}=(f_{OUT\_BW})/(m-n) \quad (11)$$

Accordingly, in deriving formulae for use in identifying spurs of interest, an embodiment of the present invention selects one frequency within the output bandwidth, arbitrarily selected to represent a spur ($f_{SPUR}$) and translates the selected frequency to the intermediate frequency as an IF spur representation ($f_{IF\_SPUR}$). The IF spur representation may be expanded by the appropriate translated bandwidth ($f_{IF\_OUT\_BW}$) to identify a spur exclusion zone ($f_{SPUR\_EX}$) or avoiding spurs in the output bandwidth, where:

$$f_{SPUR\_EX}=f_{IF\_SPUR} \pm f_{IF\_OUT\_BW}/2 \quad (12)$$

That is, a spur associated with a given in, m, n, $f_{IN}$, and $f_{OUT}$ falling within the output frequency band must be altered in frequency, such as through adjustment of the first and/or second LO frequencies, a sufficient amount to fall outside of the output bandwidth. Thus an exclusion zone corresponding to the output frequency band and appropriately placed with respect to a spur identifies a range of frequencies in which spurs which would appear in the output frequency band may fall.

Preferably, a representative spur ($f_{SPUR}$) is selected in each of the output frequency bandwidth and its image for the above translation to the intermediate frequency. In a preferred embodiment of the invention, the representative spur is selected as the center frequency of each such output frequency bandwidth (+$f_{OUT}$ and −$f_{OUT}$) to simplify expansion of the IF spur representation ($f_{SPUR}$) by the translated output frequency range ($f_{IF\_OUT\_BW}$) through symmetry. Of course, other representative spurs may be selected for use according to embodiments of the invention.

Selecting as a spur of interest for a given m, n, $f_{IN}$, and $f_{OUT}$ as the output center frequency ($f_{SPUR}$=+$f_{OUT}$), and using the spur equation given above as equation (1), we have:

$$+f_{OUT}=n\times f_{LO1}-m\times f_{LO2} \qquad (13)$$

It should be appreciated that equation (13) has substituted +$f_{OUT}$ for $f_{SPUR}$ of equation (1) because in the assumption $f_{SPUR}$=+$f_{OUT}$. To translate frequencies at the output frequency bandwidth to the intermediate frequency bandwidth, the second local oscillator frequency may be added to an output frequency to translate that frequency to an intermediate frequency. Therefore, translating the frequencies of equation (13) to the first IF gives:

$$f_{LO2}+f_{OUT}=n\times f_{LO1}-m\times f_{LO2}+f_{LO2} \qquad (14)$$

The LO frequencies, $f_{LO1}$ and $f_{LO2}$, in equation (14) may be restated in terms of the IF ($f_{IF}$) to find the IF where the spur is at the output center frequency ($f_{SPUR}$=+$f_{OUT}$). Restating $f_{LO1}$ and $f_{LO2}$ in terms of $f_{IF}$ gives:

$$f_{IF}=n(f_{IN}+f_{IF})-(m-1)-(f_{IF}-f_{OUT}) \qquad (15)$$

Solving $f_{IF}$ in equation (15) gives:

$$f_{IF}=(n\times f_{IN}+(m-1)f_{OUT})/(m-n) \qquad (16)$$

Similarly, selecting as a spur of interest for a given m, n, $f_{IN}$ and $f_{OUT}$ as the output image center frequency ($f_{SPUR}$=−$f_{OUT}$), and using the spur equation given above as equation (1), we have:

$$-f_{OUT}=n\times f_{LO1}-m\times f_{LO2} \qquad (17)$$

Equation (17), similar to equation (13) discussed above, has substituted −$f_{OUT}$ for $f_{SPUR}$ of equation (1) because in the assumption $f_{SPUR}$=−$f_{OUT}$. To translate frequencies at the output frequency bandwidth to the intermediate frequency bandwidth, the second local oscillator frequency may be added to an output frequency to translate that frequency to an intermediate frequency. Therefore, translating the frequencies of equation (17) to the first IF gives:

$$f_{LO2}-f_{OUT}=n\times f_{LO1}-m\times f_{LO2}+f_{LO2} \qquad (18)$$

The LO frequencies ($f_{LO1}$ and $f_{LO2}$) in equation (18) may be restated in terms of the IF ($f_{IF}$) to find the IF where the spur is at the output center frequency ($f_{SPUR}$=−$f_{OUT}$). Restating $f_{LO1}$ and $f_{LO2}$ in terms of $f_{IF}$ gives:

$$f_{IF}=n(f_{IN}+f_{IF})-m(f_{IF}-f_{OUT})+f_{IF}-f_{OUT}+2f_{OUT} \qquad (19)$$

or:

$$f_{IF}(m-n)=n\times f_{IN}+m\times f_{OUT} \qquad (20)$$

Solving for $f_{IF}$ in equation (20) gives:

$$f_{IF}=(n\times f_{IN}(m+1)f_{OUT})/(m-n) \qquad (21)$$

It should be appreciated that equations (16) and (21) above provide translation of a spur ($f_{SPUR}$) to the intermediate frequency, and thus each provide an IF spur representation ($f_{IF\_SPUR}$). That is, equation (16) provides an IF spur representation for a spur appearing at +$f_{OUT}$($f_{IF\_SPUR+}$) and equation (21) provides an IF spur representation for a spur appearing at −$f_{OUT}$($f_{IF\_SPUR-}$). Accordingly, replacing $f_{IF}$ in equations (16) and (21) with the appropriate spur designator gives:

$$f_{IF\_SPUR+}=(n\times f_{IN}(m-1)f_{OUT})/(m-n) \qquad (22)$$

$$f_{IF\_SPUR-}=(n\times f_{IN}+(m+1)f_{OUT})/(m-n) \qquad (23)$$

The IF spur representations represented in equations (22) and (23) may be expanded by the translated bandwidth ($f_{IF\_OUT\_BW}$) according to embodiments of the invention to identify spur exclusion zones ($f_{SPUR\_EX}$). That is:

$$f_{SPUR\_EX}=f_{IF\_SPUR}\pm f_{IF\_OUT\_BW}/2 \qquad (24)$$

Such spur exclusion zones identify a range in which local oscillator frequency adjustment is insufficient to move the identified spur out of the output frequency band or its image.

An embodiment of an algorithm operable according to the present invention determines if a spur is indicated in the output frequency band or its image by analyzing local oscillator harmonic changes within a band of the intermediate frequency (e.g., between points A and B). If it is determined that there is a harmonic change within the band, indicating that a harmonic falls somewhere in the band, the location of the spur (as translated to the intermediate frequency) is preferably determined (e.g., using equation (22) and/or (23)). A spur exclusion zone is then preferably identified in association with the spur intermediate frequency location. Having identified various spur locations (perhaps scored, such as with respect to potential output signal degradation associated therewith), and their associated exclusion zones, operation of the algorithm may select local oscillator frequencies which avoid some or all identified spurs.

Figure 6:
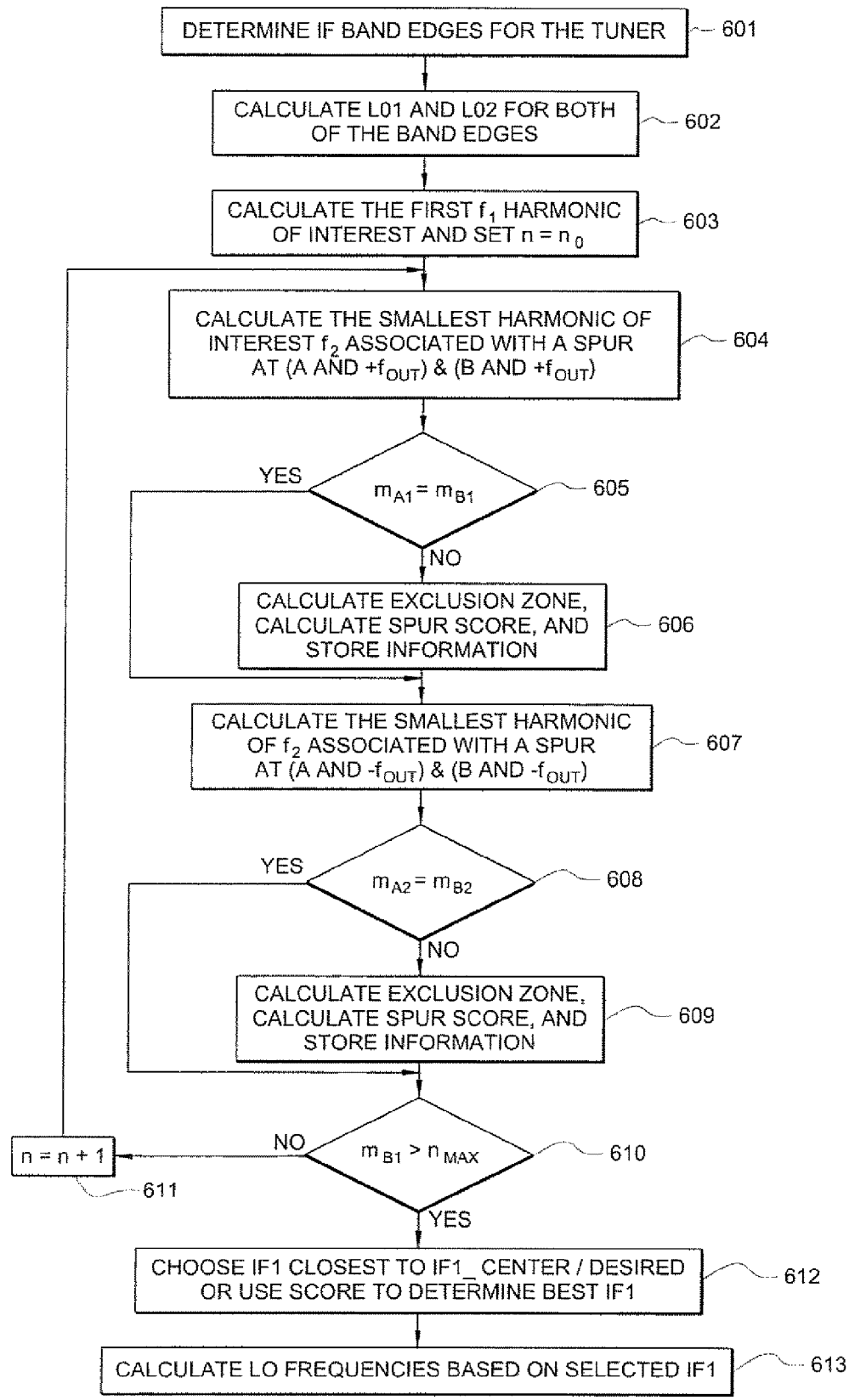
FIG. 6 shows one embodiment of a method of practicing concepts of the present invention.

Directing attention to FIG. 6, details with respect to one method operable in accordance with the above for eliminating or minimizing the effect of spurs in an output of a tuner system, such as tuner system 200 of FIG. 2, is shown. It should be appreciated that the algorithm of FIG. 6 can be implemented by a general purpose digital computer. Alternatively, the processes may be executed by a dedicated, special purpose processor. In one embodiment of the present invention, the processor may be on the same board as the tuner(s), associated memory, and other discrete electronics. In another embodiment, the processor and tuner(s) may be on a single integrated circuit. In another embodiment, the processor may be remotely disposed and in communication with the tuner(s). According to one embodiment, the processes of the illustrated method are performed by controller 250 shown in FIG. 2.

At block 601, the band edges of the intermediate frequency bandwidth or the range of intermediate frequencies likely to appear in the output frequency or its image bandwidth are determined. That is, upper and lower intermediate frequency limits of interest, identified as points A (minimum $f_{IF}$ of interest) and B (maximum $f_{IF}$ of interest) in the embodiment illustrated in FIG. 3, are determined. These points may be represented as:

$$A=f_{IF\_CENTER}-f_{IF\_BW}/2-f_{OUT\_BW}/2 \qquad (25)$$

$$B=f_{IF\_CENTER}+f_{IF\_BW}/2+f_{OUT\_BW}/2 \qquad (26)$$

At block 602, the local oscillator frequencies associated with the band edges identified above are determined. These local oscillator frequencies may be determined as follows:

$$f_{LO1,MIN}=A+f_{IN} \qquad (27)$$

$$f_{LO2,MIN}=A-f_{OUT} \qquad (28)$$

$$f_{LO1,MAX}=B+f_{IN} \qquad (29)$$

$$f_{LO2,MAX}=B-f_{OUT} \qquad (30)$$

At block 603, the first LO1 harmonic of interest, $n_0$, is calculated. According to a preferred embodiment, the first harmonic of interest is the first LO1 harmonic that could possibly result in a spur, translated to the intermediate frequency, which falls within the identified intermediate frequency band edges. The first harmonic of interest for LO1 may be determined as follows.

$$n_o = \left\lfloor \frac{f_{LO2,MIN} - A}{f_{LO1MIN} - f_{LO2MIN}} \right\rfloor \quad (31)$$

As the first pass through iterative processes of the method illustrated in FIG. 6, n (representing a selected harmonic of LO1) is set to $n_0$ (representing the lowest LO1 harmonic analyzed).

At block 604, the smallest harmonic of LO2, $m_{A1}$, associated with a spur at point A for $+f_{OUT}$ and the smallest harmonic of LO2, $m_{B1}$, associated with a spur at point B for $+f_{OUT}$ is calculated for a given n (e.g., $n_0$ in a first iteration). The smallest harmonics at points A and B for LO2 for a given LO1 harmonic may be determined as follows:

$$m_{A1} = \left\lfloor \frac{nxf_{LO1MIN} - f_{OUT}}{f_{LO2MIN}} \right\rfloor \quad (32)$$

$$m_{B1} = \left\lfloor \frac{nxf_{LO1MAX} - f_{OUT}}{f_{LO2MAX}} \right\rfloor \quad (33)$$

A determination is made at block 605 as to whether the smallest harmonic of LO2 associated with a spur at point A, $m_{A1}$, for $+f_{OUT}$ and the smallest harmonic of LO2 associated with a spur at point B, $m_{B1}$, for $+f_{OUT}$ are equal. If the harmonics are equal, no spur falls between. That is, if the harmonic does not change in integer value between point A (a lowest IF frequency of interest) and point B (a highest IF frequency of interest) there is no spur associated with the frequencies within this range.

If it is determined that $m_{A1} \neq m_{B1}$ at block 605, the illustrated method proceeds to block 606 wherein the location of the spur, $f_{SPUR}$, is calculated and the spur exclusion zone, $f_{SPUR\_EX}$, is determined. The spur may be calculated for the identified n and m in using equation (22). That is:

$$f_{IF\_SPUR+} = (nxf_{IN}(m_{A1}-1)(f_{OUT})/(m_{A1}-n) \quad (34)$$

From equation (24) above it is known that $f_{SPUR\_EX} = f_{IF\_SPUR} \pm f_{IF\_OUT\_BW}/2+$ Accordingly, the exclusion zone for the identified spur can be calculated as follows:

$$f_{SPUR\_EX} = ((nxf_{IN}+(m_{A1}-1)f_{OUT})/(m_{A1}-n)) \pm f_{IF\_OUT\_BW}/2 \quad (35)$$

In addition to determining the exclusion zone, embodiments of the present invention further operate to score the spur with respect to the spur's likelihood, or predicted severity, of causing undesired results with respect to the output frequency band. For example, the values of n and/or m (the harmonic degree) may be used in scoring a spur (e.g., the larger the harmonic degree, the smaller in magnitude the spur and thus the less likely the spur is to cause undesired results in the output frequency band).

If however, it is determined that $m_{A1} = m_{B1}$ at block 605, the illustrated method proceeds to block 607. At block 607, the smallest harmonic of LO2, $m_{A2}$, associated with a spur at point A for $-f_{OUT}$ and the smallest harmonic of LO2, $m_{B2}$, associated with a spur at point B for $-f_{OUT}$ is calculated for a given n (e.g., $n_0$ in a first iteration). The smallest harmonics at points A and B for LO2 for a given LO1 harmonic may be determined as follows:

$$m_{A2} = \left\lfloor \frac{nxf_{LO1MIN} + f_{OUT}}{f_{LO2MIN}} \right\rfloor \quad (36)$$

$$m_{B2} = \left\lfloor \frac{nxf_{LO1MAX} + f_{OUT}}{f_{LO2MAX}} \right\rfloor \quad (37)$$

A determination is made at block 608 as to whether the smallest harmonic of LO2 associated with a spur at point A, $m_{A2}$, $f_{OUT}$ and the smallest harmonic of LO2 associated with a spur at point B, $m_{B2}$, for $-f_{OUT}$ are equal. If the harmonics are equal, no spur falls between. That is, if the harmonic does not change in integer value between point A (a lowest IF frequency of interest) and point B (a highest IF frequency of interest) there is no spur associated with the frequencies within this range.

If it is determined that $m_{A2} \neq m_{B2}$ at block 608, the illustrated method proceeds to block 609 wherein the location of the spur, $f_{SPUR}$, is calculated and the spur exclusion zone, $f_{SPUR\_EX}$, is determined. The spur may be calculated for the identified n and m using equation (23). That is:

$$f_{IF\_SPUR-} = (nxf_{IN}+(m_{A2}+1)f_{OUT})/(m_{A2}-n) \quad (38)$$

From equation (24) above it is known that $f_{SPUR\_EX} = f_{IF\_SPUR} \pm f_{IF\_OUT\_BW}/2$. Accordingly, the exclusion zone for the identified spur can be calculated as follows:

$$f_{SPUR\_EX} = ((nxf_{IN}+(m_{A2}+1)f_{OUT})/(m_{A2}-n)) \pm f_{IF\_OUT\_BW}/2 \quad (39)$$

In addition to determining the exclusion zone, embodiments of the present invention further operate to score the spur with respect to the spur's likelihood, or predicted severity, of causing undesired results with respect to the output frequency band. For example, the values of n and/or m (the harmonic degree) may be used in scoring a spur (e.g., the larger the harmonic degree, the smaller in magnitude the spur and thus the less likely the spur is to cause undesired results in the output frequency band).

A determination is made at block 610 as to whether the smallest harmonic of LO2 associated with a spur at point B (e.g., $m_{B1}$) analyzed above is greater than a selected harmonic of LO1 (e.g., $n_{MAX}$). The maximum harmonic of LO1 used with respect to the foregoing determination may be selected from an order of harmonic degrees (e.g., 15) likely to cause undesired results in the output frequency band.

If it is determined at block 610 that the identified harmonic of LO2 is not greater than a selected maximum harmonic of LO1, processing according to the illustrated embodiment proceeds to block 611 wherein the LO1 harmonic is incremented (n=n+1) for another iteration of processing according to blocks 604-610. However, if it is determined at block 610 that the identified harmonic of LO2 is greater than a selected maximum harmonic of LO1, a desired degree of harmonics have been processed according to blocks 604-610 and thus processing according to the illustrated embodiment proceeds to block 612.

At block 612, an intermediate frequency, $f_{IF}$, is selected based upon the exclusion zones identified through operation of the processes of blocks 604-610. According to a preferred embodiment, an intermediate frequency which is outside of all identified exclusion zones, and preferably which is closest to the intermediate frequency band center frequency, is selected as the intermediate frequency for tuning a given $f_{IN}$ to a given $f_{OUT}$. It should be appreciated that the aforementioned exclusion zones may substantially cover the intermediate frequency bandwidth. Likewise, the exclusion zones may substantially exclude only otherwise undesirable intermediate frequencies within the intermediate frequency bandwidth (e.g., intermediate frequencies at the extreme edges of the intermediate frequency bandwidth). Accordingly, embodiments of the invention may operate to select an intermediate frequency that falls within an exclusion zone. For example, using the aforementioned spur scoring, an embodiment of the invention may select an intermediate frequency having a spur in the output frequency bandwidth, or its image, with a score indicative of that spur resulting in little undesired effects.

At block 613, the local oscillator frequencies, LO1 and LO2, are selected based upon the selected intermediate frequency. For example, knowing $f_{IF}$, LO1 may be selected for a given $f_{IN}$ to result in the signal of $f_{IN}$ being converted to $f_{IF}$. Likewise, knowing $f_{IF}$, LO2 may be selected for a given $f_{OUT}$ to result in the signal of $f_{IF}$ being converted to $f_{OUT}$. The foregoing local oscillator frequencies may be provided by a controller, such as controller 250 of FIG. 2, to local oscillator control circuitry, such as local oscillator control circuits 213 and 217 and/or 223 and 227, for tuning a tuner, such as tuner 210 and/or 220, to a desired channel.

The inventions disclosed herein promote efficient selection of IF values without resorting to the large tables of local oscillator frequencies used to avoid spurs in the prior art. Tuner flexibility and efficiency is improved since large LO frequency tables need not be calculated. Tuner proximity in multiple tuner devices can be minimized by utilizing the spur avoidance techniques of the present invention. The present invention finds particular utility with respect to multiple conversion tuners and/or multiple tuners on a single circuit board or within a single integrated circuit wherein the distance between tuners can be minimized.

Note that while the embodiments discuss local oscillator frequencies, the inventive concepts are applicable to any frequency interference sensitive circuit or system where the harmonics of frequencies could add spurs (or extraneous frequencies) into a circuit at specific frequencies. Also, note that the inventions disclosed herein can be applied to tuners having more than one intermediate frequency, such as triple or quadruple conversions tuners. Additionally, the inventions disclosed herein could be applied to combinations of single and multiple conversion tuners and to systems having any number of tuners.

Although the present invention and its advantages have been described in detail, it should be understood that various changes, substitutions and alterations can be made herein without departing from the spirit and scope of the invention as defiled by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of avoiding interfering signals in an electronic system, said method comprising:
   determining an output band of interest for a tuner;
   determining an intermediate frequency band associated with said output band;
   identifying exclusion zones within said intermediate frequency band associated with corresponding spurs in said output band by analyzing harmonics associated with first and second local oscillators;
   selecting an intermediate frequency for use in frequency conversion of an input signal to said output band based at least in part on said exclusion zones; and
   selecting at least one of a first local oscillator frequency and a second local oscillator frequency as a function of said intermediate frequency.

2. The method of claim 1, further comprising:
   determining an image of said output band of interest for said tuner, wherein said identifying exclusion zones includes identifying exclusion zones within said intermediate frequency band associated with corresponding spurs in said output band image by analyzing harmonics of first and second local oscillator frequencies.

3. The method of claim 1, wherein said analyzing harmonics comprises:
   identifying a first harmonic of interest; and
   incrementing the first harmonic of interest for iterative analysis of said harmonics.

4. The method of claim 3, wherein said first harmonic of interest comprises a first harmonic associated with said first local oscillator that could possibly result in an undesired spur.

5. The method of claim 3, wherein said incrementing is repeated until a desired harmonic degree has been analyzed.

6. The method of claim 1, wherein said exclusion zones provide information with respect to intermediate frequency values resulting in a spur being within the output band.

7. The method of claim 1, wherein said first local oscillator frequency and said second local oscillator frequency are utilized with respect to a multiple conversion tuner.

8. The method of claim 1, wherein said first local oscillator frequency is utilized with respect to a first tuner and said second local oscillator frequency is utilized with respect to a second tuner.

9. The method of claim 1, further comprising:
   scoring said spurs corresponding to said exclusion zones.

10. The method of claim 9, wherein said scoring is based at least in part on a level of effect upon a signal output in said output band associated with said spurs.

11. The method of claim 9, wherein said selecting said intermediate frequency comprises:
   selecting an intermediate frequency within said intermediate frequency band falling within an exclusion zone associated with a spur having an acceptably low score.

12. The method of claim 1, wherein said selecting said intermediate frequency comprises:
   selecting an intermediate frequency within said intermediate frequency band falling outside of all exclusion zones.

13. The method of claim 12, wherein said selecting said intermediate frequency further comprises:
   selecting said intermediate frequency to be as near a center frequency of said intermediate frequency band.

14. A method of avoiding interfering signals in an electronic system, said method comprising:
   determining an output band of interest for a tuner;
   determining an image of said output band of interest for said tuner;

selecting an intermediate frequency band associated with said output band;

iteratively analyzing harmonics associated with a first local oscillator and a second local oscillator to determine whether particular combinations of said harmonics associated with said first local oscillator and said second local oscillator result in a spur within said output band or said output band image;

identifying exclusion zones within said intermediate frequency band associated with said spurs; and selecting an intermediate frequency through reference to said exclusion zones.

15. The method of claim 14, further comprising:

selecting at least one of a frequency of said first local oscillator and a frequency of said second local oscillator for frequency conversion of an input signal to said output band as a function of said intermediate frequency.

16. The method of claim 14, wherein said iteratively analyzing harmonics comprises:

for a particular harmonic associated with said first local oscillator frequency, determining if an integer value of a harmonic of said second local oscillator frequency changes between a frequency of a lower limit of said intermediate frequency band and a frequency of an upper limit of said intermediate frequency band.

17. The method of claim 14, wherein said iteratively analyzing harmonics comprises:

identifying a first harmonic of interest with respect to said first local oscillator; and incrementing the first harmonic of interest for iterative analysis of said harmonics.

18. The method of claim 17, wherein said iteratively analyzing harmonics comprises:

analyzing a range of harmonics of interest with respect to said second local oscillator prior to incrementing said first harmonic of interest.

19. The method of claim 17, wherein said first harmonic of interest comprises a first harmonic associated with said first local oscillator that could possibly result in an undesired spur, and, wherein said incrementing is repeated until a desired harmonic degree has been analyzed.

20. The method of claim 14, wherein said exclusion zones provide information with respect to intermediate frequency values resulting in a spur being within the output band.

21. The method of claim 14, further comprising:

scoring said spurs corresponding to said exclusion zones.

22. The method of claim 21, wherein said selecting said intermediate frequency comprises:

selecting an intermediate frequency within said intermediate frequency band falling within an exclusion zone associated with a spur having an acceptably low score.

23. The method of claim 14, wherein said selecting said intermediate frequency comprises:

selecting an intermediate frequency within said intermediate frequency band falling outside of all exclusion zones.

24. The method of claim 23, wherein said selecting said intermediate frequency further comprises:

selecting said intermediate frequency to be as near a center frequency of said intermediate frequency band.

25. A tuner system comprising:

a first mixer which accepts an input signal and a first local oscillator signal to generate a first intermediate frequency signal within an intermediate frequency band, said intermediate frequency band being associated with an output frequency band;

a second mixer which accepts a second local oscillator signal;

means for identifying exclusion zones within said intermediate frequency band associated with corresponding spurs in said output band; and means for selecting a frequency of said first intermediate frequency signal through reference to said exclusion zones.

26. The system of claim 25, wherein said means for identifying exclusion zones identifies said exclusion zones through analysis of harmonics of said first local oscillator signal and said second local oscillator signal.

27. The system of claim 25, further comprising:

means for determining a frequency of said first local oscillator signal as a function of said first intermediate frequency signal frequency.

28. The system of claim 25, wherein said means for identifying exclusion zones comprises:

means for determining, for a particular harmonic associated with said first local oscillator frequency, if an integer value of a harmonic of said second local oscillator frequency changes between a frequency of a lower limit of said intermediate frequency band and a frequency of an upper limit of said intermediate frequency band.

29. The system of claim 25, wherein said first mixer and said second mixer are part of a multiple conversion tuner.

30. The system of claim 25, wherein said first mixer is part of a first tuner and said second mixer is part of a second tuner.

* * * * *

UNITED STATES PATENT AND TRADEMARK OFFICE
CERTIFICATE OF CORRECTION

| | | |
|---|---|---|
| PATENT NO. | : 7,904,024 B2 | Page 1 of 1 |
| APPLICATION NO. | : 11/930703 | |
| DATED | : March 8, 2011 | |
| INVENTOR(S) | : David Dessert et al. | |

It is certified that error appears in the above-identified patent and that said Letters Patent is hereby corrected as shown below:

In the Specification:

Column 2, Line 35, delete the portion of text reading "will fail" and replace with --will fall--.

Column 9, Equation 10, Line 47, delete the portion of the equation reading "$f'_{spur}$" and replace with --$f_{spur}'$--.

Column 9, Line 51, delete the portion of text reading "$f_{SPUR}$" and replace with --$f_{spur}$--.

Column 9, Line 52, delete the portion of text reading "$f_{SPUR}$" and replace with --$f_{spur}'$--.

Signed and Sealed this
Third Day of May, 2011

David J. Kappos
*Director of the United States Patent and Trademark Office*